United States Patent [19]

Chittipeddi

[11] Patent Number: 5,763,314
[45] Date of Patent: Jun. 9, 1998

[54] PROCESS FOR FORMING ISOLATION REGIONS IN AN INTEGRATED CIRCUIT

[75] Inventor: Sailesh Chittipeddi, Lehigh, Pa.

[73] Assignee: Lucent Technologies Inc., Murray Hill, N.J.

[21] Appl. No.: 620,964

[22] Filed: Mar. 22, 1996

Related U.S. Application Data

[62] Division of Ser. No. 347,527, Nov. 30, 1994.

[51] Int. Cl.$^6$ .................................................. H01L 21/76
[52] U.S. Cl. .......................................... 438/400; 438/496
[58] Field of Search ............................ 437/67, 89, 57, 437/228.5; 148/DIG. 85, DIG. 50, DIG. 86; 438/400, 496

[56] References Cited

FOREIGN PATENT DOCUMENTS

| 60-21560 | 2/1985 | Japan . |
| 62-132342 | 6/1987 | Japan . |
| 1-186669 | 7/1989 | Japan . |

*Primary Examiner*—George R. Fourson
*Attorney, Agent, or Firm*—John T. Rehberg

[57] ABSTRACT

A process for forming isolated active device regions on a silicon substrate comprises the steps of forming at least one trench in a silicon substrate to define at least two active device regions on the substrate to be isolated from each other, depositing an electrically insulative material on the substrate to fill the trench with the material, planarizing the surface of the substrate, performing a masking and etching operation to expose at least one active device region on the substrate, selectively growing a first epitaxial layer of silicon on the exposed active device region, masking the substrate to leave exposed at least one other active device region on the substrate, selectively growing a second epitaxial layer of silicon on the other exposed active device region, the first epitaxial layer and second epitaxial layer being doped with dopant atoms to the same or different dopant concentration to provide at least two isolated active device regions on the silicon substrate. The process of the invention enables the fabrication of performance optimized MOS-type and bipolar devices simultaneously and independently of each other on a single clip or wafer.

15 Claims, 3 Drawing Sheets

PROCESS FOR FORMING ISOLATION REGIONS IN AN INTEGRATED CIRCUIT

This is a divisional of application Ser. No. 08/347,527 filed Nov. 30, 1994.

TECHNICAL FIELD

This invention relates to semiconductor integrated circuits and more particularly to methods for producing electrically isolated devices in such circuits.

BACKGROUND OF THE INVENTION

Various techniques have been utilized in integrated circuit manufacturing processes to form isolated regions on silicon wafers in which various microelectronic devices, e.g., metal oxide semiconductor (MOS) and bipolar transistors, can be formed. The primary advantages gained by providing isolated regions on silicon wafers are the reduced parasitic capacitive coupling of devices to the wafers and the excellent inter-isolation of devices formed in different regions on the wafers.

A commonly used method for manufacturing MOS transistors and bipolar transistors in integrated circuits at a major surface of a semiconductive silicon substrate involves the local oxidation of silicon (LOCOS) process for electrically isolating neighboring transistors. In that process, a major surface of a silicon substrate is masked with a silicon dioxide or silicon nitride layer having window areas and the exposed silicon in these window areas is oxidized. However, as a result of lateral oxidation of silicon under the mask, the LOCOS process undesirably increases the required distance between neighboring transistors and undesirably reduces transistor packing density.

In order to avoid the aforementioned disadvantages of the LOCOS process, selective epitaxial growth (SEG) of silicon has been proposed as an alternative. In SEG, an epitaxial layer of semiconductive monocrystalline silicon is grown on selected regions of a semiconductive silicon body. These selected regions are located at the bottom of windows formed by insulating layers which are positioned on the silicon body. At the same time, no silicon accumulates on the insulating layer, hence the use of the word "selective" in SEG.

Continued efforts are directed toward the miniaturization of circuits so that more devices can be fabricated on a single chip or wafer. This applies to MOS-type circuits, such as CMOS circuits, as well as to bipolar circuits. Indeed, there exists many applications in which both MOS and bipolar circuits are utilized on the same chip.

However, MOS and bipolar circuits are commonly fabricated on a single epitaxial silicon layer which has been uniformly doped to a single, fixed dopant concentration. Thus, the number of variables which can be controlled during manufacture of both MOS and bipolar devices on a single epitaxial silicon layer is limited by the fixed concentration of dopant in the epitaxial silicon.

SUMMARY OF THE INVENTION

In accordance with the present invention, a process for forming isolated active device regions on a silicon substrate is provided. The process of the invention involves forming at least one trench in a silicon substrate to define at least two active device regions on the substrate to be electrically isolated from each other, filling the trench with an electrically insulative material, performing a masking and etching operation to expose at least one active device region on the substrate, selectively growing a first epitaxial layer of silicon on the exposed active device region, performing a masking and etching operation to expose at least one other active device region on the substrate and selectively growing a second epitaxial layer of silicon on the other exposed active device region on the substrate, the first epitaxial layer and second epitaxial layer being doped with impurity ions to the same or different doping concentrations to provide at least two isolated active device regions on the silicon substrate.

Further in accordance with the present invention, a variety of devices can be formed at the isolated active device regions on the silicon substrate to provide an integrated circuit. The active device regions can be doped to doping concentrations which are specifically tailored to the devices which are subsequently formed at those regions. Thus, a primary advantage of this invention is that performance optimized devices having different doping profiles, e.g., CMOS and bipolar devices, particularly vertical bipolar devices, can be formed simultaneously and independently of each other on the same chip. The process of the invention is carried out with a minimum of operations and avoids the need to make costly modifications to manufacturing operations.

The phrase "performance optimized" as utilized herein shall be understood to refer to devices which are maximized for current and/or voltage gain.

DETAILED DESCRIPTION OF THE PREFERRED EMBODIMENTS

FIGS. 1–7 illustrate, for purposes of example only, a process in which electrical isolation between active device regions on a silicon substrate is obtained. It should be understood, however, that each of the principles and concepts of the invention, as described in detail below, can be modified in various ways without deviating from the scope and spirit of this invention.

Figure 1:
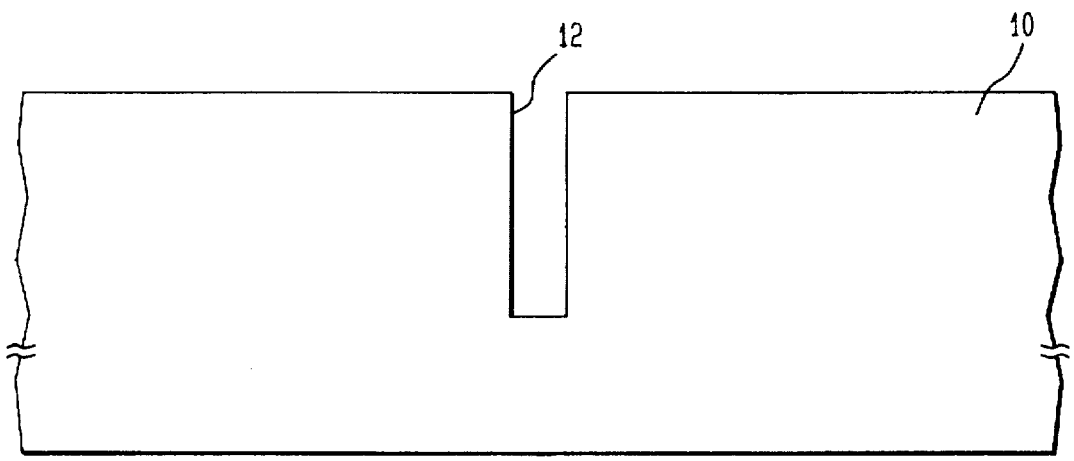
FIGS. 1–7 are diagrammatic cross-sectional views showing successive stages of processing of a silicon substrate having two isolated active device regions.

Referring to FIG. 1, there is formed in silicon substrate 10 a trench isolation structure 12. Trench 12 defines active device region 14 and active device region 16 on silicon substrate 10. Silicon substrate 10 is a silicon wafer formed by the well-known Czochralski technique and can possess any desired orientation such as a (100), (110), or (111) orientation as is familiar to those skilled in the art. Trench 12 is typically etched into substrate 10 to a depth which ranges from about 0.25 to about 5 µm and a width which ranges from about 0.25 to about 5 µm. Trench 12 can be formed utilizing any suitable technique, e.g., reactive plasma etching, which is known to be suitable for this purpose. Silicon substrate 10 can also be heavily or lightly doped with an impurity such as boron, phosphorus or antimony. The impurity can be diffused into substrate 10 by heating the substrate to a drive-in temperature ranging from about 700° to about 1200° C. for a drive-in time varying from 1 to about 6 hours. Persons skilled in the art will be familiar with the temperatures and times suited to different dopants and different depths within substrate 10.

Figure 2:
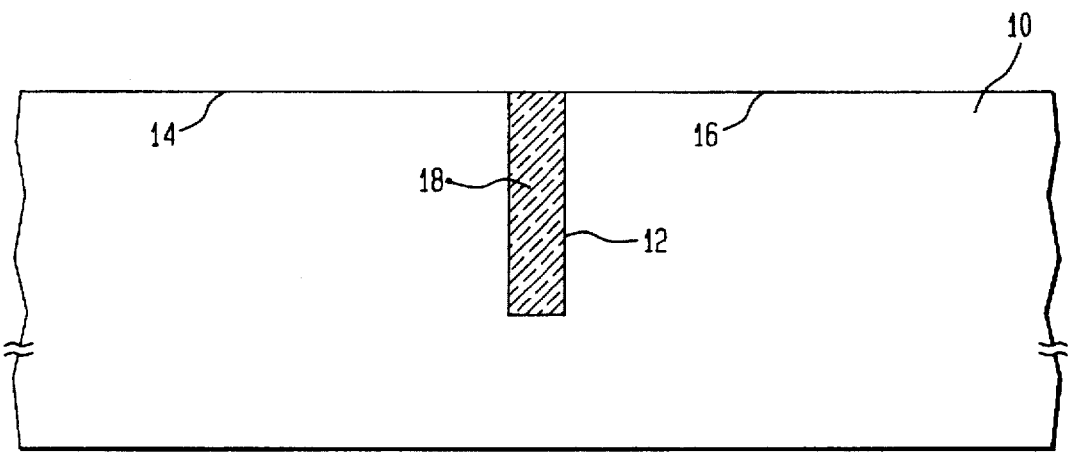

As depicted in FIG. 2, after formation of trench 12 an electrically insulative material 18, e.g., silicon dioxide, silicon nitride, tetraethoxysilane, or combination thereof, is deposited on substrate 10 to fill trench 12. In a preferred embodiment, silicon dioxide is deposited in trench 12 by conventional chemical vapor deposition techniques such as those described in Chapter 6 of S. M. Sze, *VLSI Technology*, Second Edition, McGraw-Hill Book Company (1988). Thereafter, the surface of substrate 10 is planarized by known chemical and/or mechanical methods to provide a substantially uniform planar surface as illustrated in FIG. 2.

Figure 3:
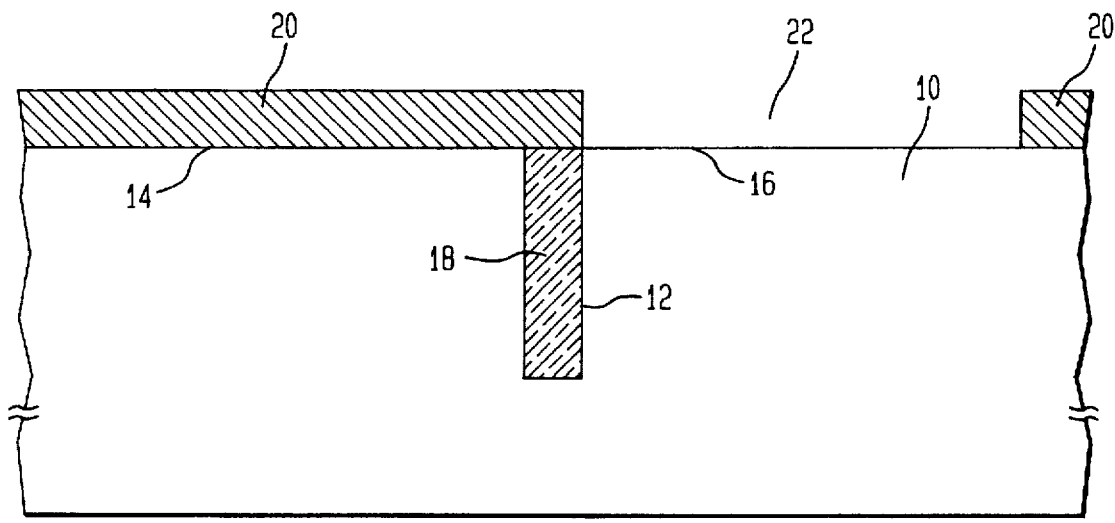

As shown in FIG. 3, after the surface of substrate 10 has been planarized, masking layer 20 composed of an oxide ($SiO_2$) or nitride ($Si_3N_4$) or other suitable material is formed on the surface of substrate 10 and thereafter selectively etched utilizing techniques which are well known in the art to provide window 22 exposing active device region 16 on substrate 10. At the same time, layer 20 masks active device region 14 and trench 12. Exposed active device region 16 can optionally be etched to remove any residual surface damage that may have occurred during the opening of window 22. Such an etch is preferably performed by subjecting the wafer to a dilute mixture of HF and $H_2O$ and $HNO_3$.

Figure 4:
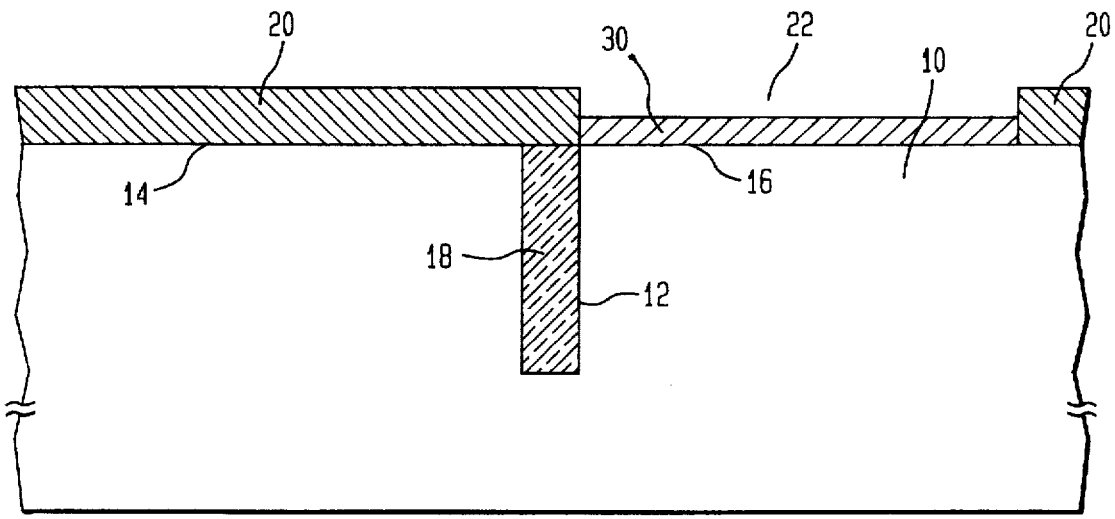

Referring now to FIG. 4, first epitaxial layer 30 of silicon is then selectively grown on exposed active device region 16 by means of conventional epitaxial deposition techniques such as vapor-phase epitaxy, i.e., chemical vapor deposition, or molecular beam epitaxy. Thickness of first epitaxial layer 30 of silicon can broadly range from about 0.5 to about 50 microns. Preferably, the growth process employed is a Type I growth process in which epitaxial silicon is grown only on exposed regions of substrate 10 and not on masking layer 20. First epitaxial layer 30 of silicon can be doped with an impurity while being grown on substrate 10 and/or be doped via ion implantation and annealing after first epitaxial layer 30 has been grown. First epitaxial layer 30 of silicon can be doped with an impurity such as boron, phosphorus, arsenic, and the like, at a dopant concentration which ranges from about $1 \times 10^{11}$ to about $1 \times 10^{17}$ ions/cm$^2$, preferably from about $1 \times 10^{12}$ to about $1 \times 10^{13}$ ions/cm$^2$. Various devices can later be formed at first epitaxial layer 30. Thus, e.g., a performance-optimized MOS-type device can be formed at first epitaxial layer in accordance with known procedures.

Figure 5:
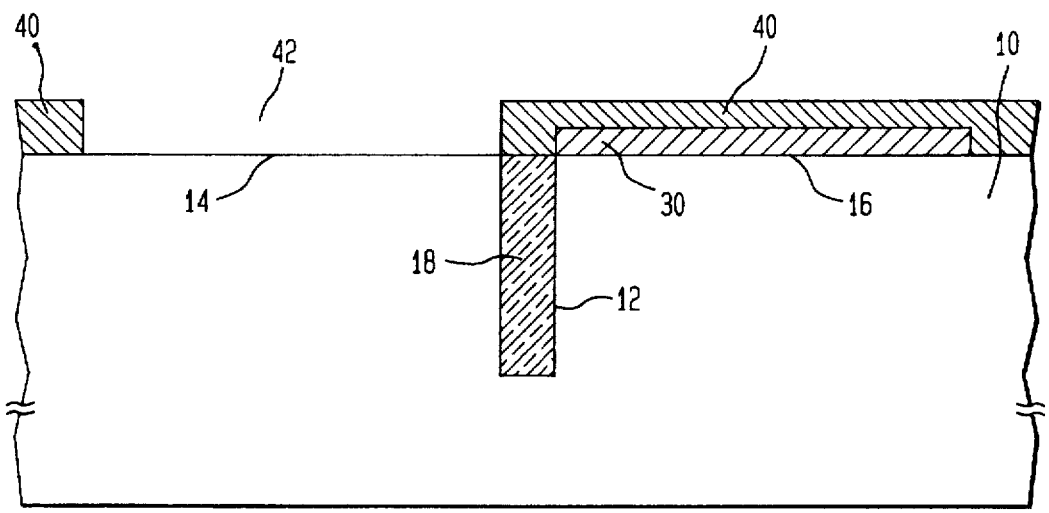

After first epitaxial layer 30 of silicon is grown on substrate 10, oxide or nitride layer 20 is stripped by, e.g., wet or dry etch, and, as shown in FIG. 5, oxide or nitride masking layer 40 is formed on the surface of substrate 10. Masking layer 40 is selectively etched in accordance with well known techniques to mask trench 12 and first epitaxial layer 30 and provide window 42 which exposes active device region 14 on substrate 10. Exposed active device region 14 can optionally be etched to remove any residual surface damage that may have occurred during the opening of window 42. Such an etch is preferably performed by subjecting the wafer to a dilute mixture of HF and $H_2O$ and $HNO_3$.

Figure 6:
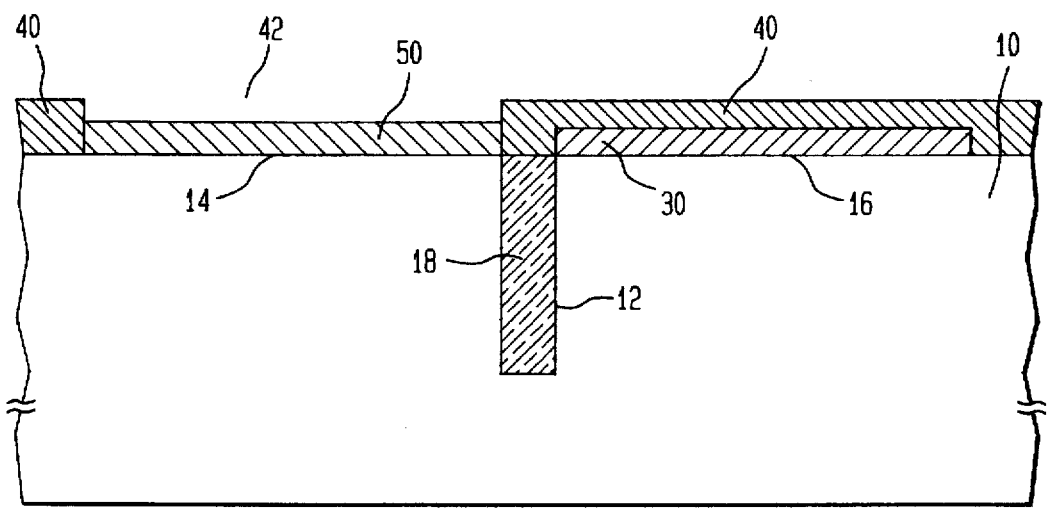

As shown in FIG. 6, second epitaxial layer 50 of silicon is selectively grown on active device region 14 by means of a conventional epitaxial growth technique such as vapor-phase epitaxy and molecular beam epitaxy. Likewise, a Type I growth process is preferably employed. Thickness of second epitaxial layer 50 of silicon can broadly range from about 0.5 to about 50 microns. Second epitaxial layer 50 can be doped with an impurity while being grown on substrate 10 and/or be doped via ion implantation and annealing after being grown. Impurities such as boron, phosphorus, arsenic, and the like, can be diffused or implanted in second epitaxial layer 50 at a dopant concentration which ranges from about $1 \times 10^{11}$ to about $1 \times 10^{17}$ ions/cm$^2$, preferably from about $1 \times 10^{12}$ to about $1 \times 10^{13}$ ions/cm$^3$. The dopant concentration of the second epitaxial layer of silicon can be the same or different as the dopant concentration of the first epitaxial layer of silicon. Thus, in accordance with this invention, a performance-optimized bipolar device can later be formed at second epitaxial layer 50 in accordance with known procedures.

Figure 7:
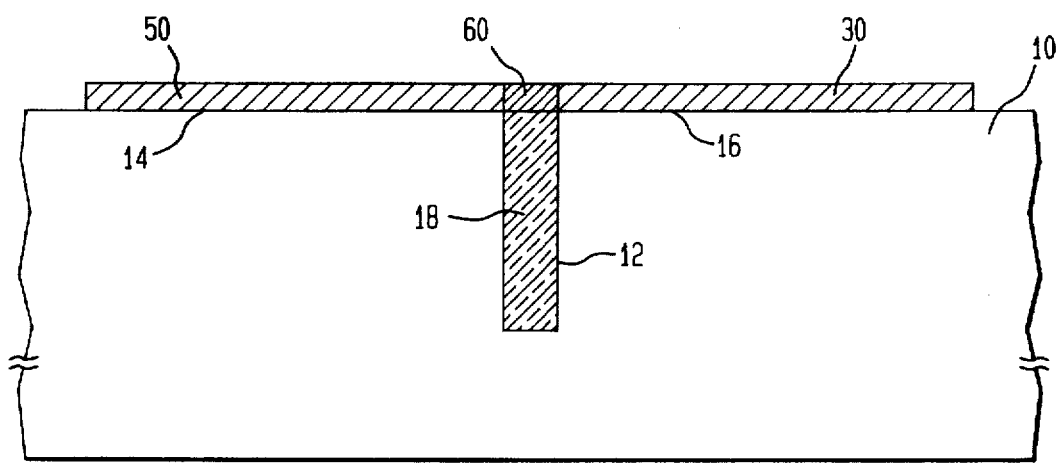

As shown in FIG. 7, after second epitaxial layer 50 of silicon is grown on substrate 10, oxide or nitride masking layer 40 is removed by, e.g., wet or dry etch. Optionally, an electrically insulative material such as silicon dioxide, silicon nitride, tetraethoxysilane, or the like, can be deposited on substrate 10 and thereafter planarized to provide a substantially planar surface as shown in FIG. 7.

Since epitaxial layers 30 and 50 can possess the same or different dopant concentrations, both MOS and bipolar devices which are individually performance optimized can thereafter be simultaneously formed on epitaxial layers 30 and 50. Performance-optimized devices that can simultaneously be formed on epitaxial layers 30 and 50 in accordance with this invention include MOS devices, e.g., n-MOS, p-MOS and CMOS devices, bipolar devices, capacitors, resistors, thin-film transistors, heterojunction devices, to name just a few. In a preferred embodiment a CMOS and bipolar device, e.g., vertical bipolar transistor, are simultaneously and independently formed on epitaxial layers 30 and 50. The current gains of these devices can be optimized based on the specific application of each device in accordance with this invention.

Thus, in accordance with the present invention there is provided an integrated circuit possessing at least two different devices which are independently performance optimized.

Also contemplated within the scope of this invention is the selective deposition of at least two electrically isolated epitaxial layers of silicon which, in addition to being doped to the same or different dopant concentrations, are also of different thicknesses. The present invention can also be applied to the formation of electrically isolated layers of polycrystalline silicon, silicon-germanium, and other semiconductor layers which are grown through the use of crystal growth techniques. It is also contemplated that the first epitaxial layer and second epitaxial layer herein can be doped with different dopant atoms.

While the invention has been particularly shown and described with reference to these various embodiments, it will be recognized by those skilled in the art that modifications and changes may be made to the present invention without departing from the spirit and scope thereof, which is set forth in the following claims.

What is claimed is:

1. A process for forming isolated active device regions on a silicon substrate which comprises:

a) forming at lease one trench in a silicon substrate to define first and second active device regions on the substrate to be isolated from each other; then b) depositing an electrically insulative material on the substrate to fill the trench with the material; then c) planarizing the surface of the resulting substrate to expose the first and second active device regions; then d) covering the second active device region and the trench with a first masking layer and then selectively growing a first epitaxial layer of silicon on the first active device region; then e) removing the first masking layer and covering the first epitaxial layer of silicon and the trench with a second masking layer and then selectively growing a second epitaxial layer of silicon on the second active device region, the first epitaxial layer and second epitaxial layer being doped with dopant atoms to the same or different dopant concentration, to provide at least two isolated active device regions on the silicon substrate.

2. The process of claim 1 wherein the silicon substrate is a doped silicon wafer.

3. The process of claim 1 wherein the trench is etched into the substrate to a depth of about 0.25 to about 5 µm and a width of about 0.25 to about 5 µm.

4. The process of claim 1 wherein the insulative material is selected from the group consisting of silicon dioxide, and silicon nitride.

5. The process of claim 1 wherein the dopant atoms are selected from the group consisting of boron, phosphorus and arsenic.

6. The process of claim 1 wherein the first epitaxial layer is doped with a dopant dose of about $1\times10^{11}$ to about $1\times10^{17}$ ions/cm$^2$.

7. The process of claim 1 wherein the first epitaxial layer is doped with a dopant dose of about $1\times10^{12}$ to about $1\times10^{13}$ ions/cm$^2$.

8. The process of claim 1 wherein the second epitaxial layer is doped with a dopant dose of about $1\times10^{11}$ to about $1\times10^{17}$ ions/cm$^2$.

9. The process of claim 1 wherein the second epitaxial layer is doped with a dopant dose of about $1\times10^{12}$ to about $1\times10^{13}$ ions/cm$^2$.

10. The process of claim 1 wherein the dopant concentration of the first epitaxial layer is different than the dopant concentration of the second epitaxial layer.

11. The process of claim 1 which further comprises fabricating first and second devices at the first and second epitaxial layers, respectively, to produce a semiconductor integrated circuit.

12. The process of claim 11 wherein the devices are selected from the group consisting of MOS, bipolar, capacitor, resistor, thin-film and heterojunction devices.

13. The process of claim 11 wherein a CMOS device is fabricated at the first epitaxial layer and a bipolar device is fabricated at the second epitaxial layer.

14. The process of claim 1 wherein the thickness of the first epitaxial layer is different than the thickness of the second epitaxial layer.

15. The process of claim 1 wherein the first epitaxial layer and second epitaxial layer are doped with different dopant atoms.

* * * * *